(12) United States Patent
Ajmera et al.

(10) Patent No.: US 7,781,884 B2
(45) Date of Patent: Aug. 24, 2010

(54) METHOD OF FABRICATION OF ON-CHIP HEAT PIPES AND ANCILLARY HEAT TRANSFER COMPONENTS

(75) Inventors: Sameer Kumar Ajmera, Richardson, TX (US); Phillip D. Matz, Allentown, PA (US); Stephan Grunow, Dallas, TX (US); Satyavolu Srinivas Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/863,477

(22) Filed: Sep. 28, 2007

(65) Prior Publication Data

US 2009/0085197 A1 Apr. 2, 2009

(51) Int. Cl.
*H01L 23/34* (2006.01)
(52) U.S. Cl. .................. 257/715; 257/276; 257/706; 257/707; 257/712; 257/713; 257/714; 257/717; 257/E33.075
(58) Field of Classification Search ................. 257/276, 257/625, 675, 706, 707, 712–722, 796, E33.075, 257/E31.131, E23.051, E23.08–E23.113
See application file for complete search history.

(56) References Cited

U.S. PATENT DOCUMENTS 6,346,747 B1 * 2/2002 Grill et al. .................. 257/752
2005/0082043 A1 * 4/2005 Sarraf ..................... 165/104.33
2006/0006525 A1 * 1/2006 Mullen et al. ................ 257/712
2006/0065387 A1 * 3/2006 Tonapi et al. ................ 165/185
2006/0124280 A1 * 6/2006 Lee et al. ................ 165/104.26
2006/0133039 A1 * 6/2006 Belady ....................... 361/699
2009/0040726 A1 * 2/2009 Hoffman et al. ............. 361/700

* cited by examiner

*Primary Examiner*—N Drew Richards
*Assistant Examiner*—Yu-Hsi Sun
(74) *Attorney, Agent, or Firm*—John J. Patti; Wade J. Brady, III; Frederick J. Telecky, Jr.

(57) ABSTRACT

The density of components in integrated circuits (ICs) is increasing with time. The density of heat generated by the components is similarly increasing. Maintaining the temperature of the components at reliable operating levels requires increased thermal transfer rates from the components to the IC package exterior. Dielectric materials used in interconnect regions have lower thermal conductivity than silicon dioxide. This invention comprises a heat pipe located in the interconnect region of an IC to transfer heat generated by components in the IC substrate to metal plugs located on the top surface of the IC, where the heat is easily conducted to the exterior of the IC package. Refinements such as a wicking liner or reticulated inner surface will increase the thermal transfer efficiency of the heat pipe. Strengthening elements in the interior of the heat pipe will provide robustness to mechanical stress during IC manufacture.

23 Claims, 4 Drawing Sheets

METHOD OF FABRICATION OF ON-CHIP HEAT PIPES AND ANCILLARY HEAT TRANSFER COMPONENTS

FIELD OF THE INVENTION

This invention relates to the field of integrated circuits. More particularly, this invention relates to thermally conductive components in integrated circuits.

BACKGROUND OF THE INVENTION

It is well known that integrated circuits (ICs) are comprised of various electrical components fabricated in and on electronic substrates, such as silicon wafers, and may include metal oxide semiconductor (MOS) transistors, bipolar transistors, diodes, resistors, and capacitors. These components are connected to form electronic circuits by fabricating a series of vertical and horizontal metal interconnects, separated by dielectric materials, in the region above the components. The components generate heat when the integrated circuit is operated, requiring measures to be taken to dissipate this heat to avoid raising the temperature of the components in the integrated circuit above reliable operating temperatures, typically 100 to 130 degrees C. Heat dissipation measures, which may include heatsinks attached to the IC package or cooling fans blowing on the IC package, are typically configured to dissipate the heat generated by the IC and maintain the temperature of the components in the IC in a reliable operational temperature range, with a difference in temperature between the components in the integrated circuit and the external surface of the IC package in a range of 20 to 40 degrees C. Most of the heat generated by components in the IC is conducted mainly through the IC substrate, typically silicon, and through the interconnects over the components.

It is also well known that densities of components in integrated circuits are increasing with time, as articulated by Moore's Law, resulting in increasing power densities generated by the latest ICs. To maintain 20 to 40 degree C. temperature difference between the components in the integrated circuit and the external surface of the IC package, the thermal conductance of the elements in the IC package, including the IC itself, must increase with the increase in power dissipated by the circuits in the IC.

While the requirements for higher thermal conductance in the IC are increasing, two trends in interconnect fabrication are producing decreased thermal conductance through the interconnect region over the IC components. First, the number of interconnect levels is increasing over time, lengthening the thermal path between the IC components and the top surface of the IC. Second, the dielectric materials used to isolate the interconnect elements from each other are changing to less dense substances, in order to reduce capacitive coupling between circuit elements, which has a side effect of reduced thermal conductivity.

SUMMARY OF THE INVENTION

A heat pipe is fabricated in the interconnect region of an integrated circuit (IC), using planar fabrication methods common to IC manufacture. The heat pipe is oriented with a heat intake end near the heat generating components in the IC, and a heat output end in contact with bondpad material on the IC top surface. A working fluid in the heat pipe is selected to optimize the heat transfer rate in the operating temperature range of the IC, and to be compatible with wall materials in the heat pipe. A wicking material may be formed on the interior surface of the heat pipe to increase thermal transfer efficiency of the heat pipe. The interior surface of the heat pipe may be reticulated to improve wicking action of the working fluid, and thus to increase thermal transfer efficiency of the heat pipe. Strengthening members may be added to the interior region of the heat pipe to provide robustness during IC manufacture.

DETAILED DESCRIPTION

Figure 1A:
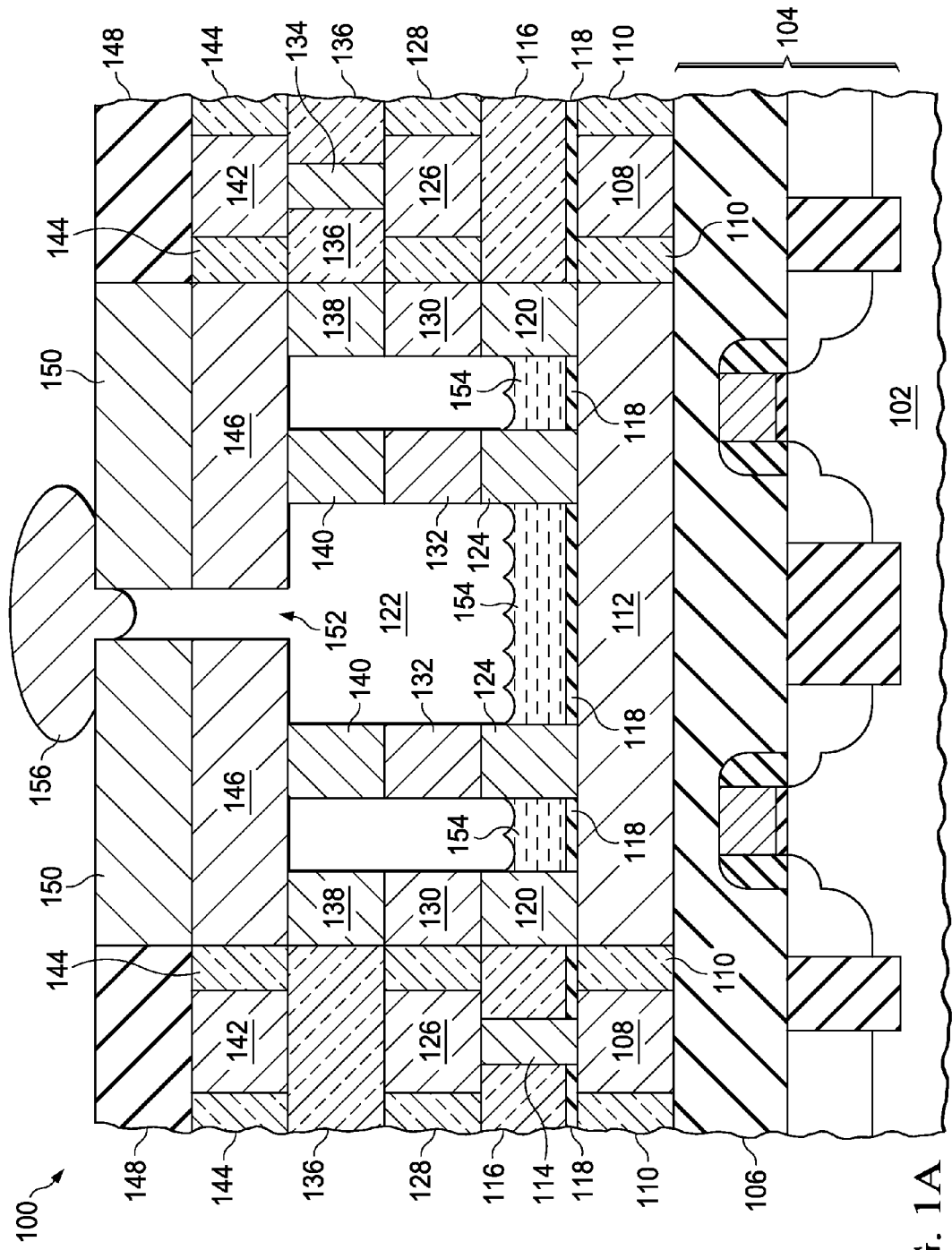
FIG. 1A is a cross-section of an integrated circuit with an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A is a cross-section of an integrated circuit (IC) with an embodiment of the instant invention. An integrated circuit (100) provides a substrate (102) in which are fabricated transistors (104) (which include source/drain regions and gate structures) and other components (not shown for clarity). A pre-metal dielectric (PMD) layer (106) is deposited over the substrate (102), transistors (104) and other components in the IC. A first level of interconnects, known as metal 1, comprising horizontal metal lines (108) and intra-metal dielectric (IMD1) (110), is formed over the PMD (106).

In a first region, a bottom element (112) of a heat pipe is formed. The bottom element or bottom element layer is generally comprised of aluminum or copper. A second level of interconnects, known as via 1, comprising vertical metal vias (114), inter-level dielectric (ILD1) (116) and an optional via 1 etch stop dielectric layer (118), is formed over the metal 1 level of interconnects. Additionally, a first section of wall (120) of the heat pipe is formed, making contact with the heat pipe bottom element (112) continuously around the perimeter of the heat pipe bottom element, thus enclosing the interior region (122) of the heat pipe, so that working fluid, to be discussed below, cannot leak from the interior region of the heat pipe to the exterior region of the heat pipe between the bottom element and the first section of wall, defined for the purposes of this disclosure as "in a sealing manner." Optional pieces of heat pipe wall material may be added to the interior region of the heat pipe as strengthening elements (124) to add mechanical strength to the heat pipe. The interior region of the heat pipe is filled with a dielectric material selected for ease of etching in a subsequent step. A third level of interconnects, known as metal 2, comprising horizontal metal lines (126) and intra-metal dielectric (IMD2) (128), is formed over the second interconnect level. In the region defined for the first embodiment of the instant invention, a second section of wall (130) of the heat pipe is formed, making contact with first section of heat pipe wall (120) continuously around the perimeter of the first section of heat pipe wall in a sealing manner. If optional strengthening pieces (124) are present, additional material (132) is added to keep the height of the strengthening elements the same height as the heat pipe wall. As in the previous interconnect level, the interior region of the heat pipe is filled with a dielectric material selected for ease of etching in a subsequent step. A fourth level of interconnects, known as via 2, comprising vertical metal vias (134), inter-level dielectric (ILD2) (136) and an optional via 2 etch stop dielectric layer (not shown for clarity), is formed over the metal 2 level of interconnects.

Also in the first region, a third section of wall (138) of the heat pipe is formed, making contact with second section of heat pipe wall (130) continuously around the perimeter of the second section of heat pipe wall in a sealing manner. If optional strengthening pieces (124) are present, additional material (140) is added to keep the height of the strengthening elements the same height as the heat pipe wall. As in the previous interconnect level, the interior region of the heat pipe is filled with a dielectric material selected for ease of etching in a subsequent step. A fifth level of interconnects, known as metal 3, comprising horizontal metal lines (142) and intra-metal dielectric (IMD3) (144), is formed over the fourth interconnect level. In the region defined for the first embodiment of the instant invention, a top element (146) is formed, making contact with the third heat pipe wall section (138) continuously around the perimeter of the third heat pipe wall section in a sealing manner. A final level of interconnect, comprising a protective overcoat layer stack (148), typically comprised of layers of silicon nitride and silicon oxy-nitride, and aluminum bondpads (150). Typically, the wall layers (120), (130), and (138) and top element layer 146 are referred to as an enclosure, where each of the layer can include aluminum or copper.

An extraction via (152) is etched through the aluminum bondpad (150) (which can also be part of the enclosure) and heat pipe top element (146) to reach the dielectric material in the interior region (122) of the heat pipe. Dielectric material in the interior region (122) of the heat pipe is removed, for example by use of a super critical fluid etchant, as described in U.S. Pat. No. 7,179,747. A working fluid (154), possibly comprised of one of the following fluids: acetone, methanol, perfluoromethylcyclohexane, ethanol, water, or toluene, is transferred into the interior region of the heat pipe. A plug (156), possibly comprised of solder, is positioned on the extraction via (152) and attached to the aluminum bondpad (150) region around the extraction via (152) so as to seal the interior region of the heat pipe against loss of the working fluid (154). The heat pipe thus formed has a higher thermal conductivity between the substrate (102) and the top surface of the IC containing the protective overcoat layer stack (148) and bondpads (150) than the interconnect levels comprising metals lines and vias. This is advantageous because simpler and cheaper heat dissipation means external to the IC package may be employed to maintain the temperature of the components of the IC in a reliable operating range. The plug (156) may be attached to additional heat dissipation means within the IC package to further improve heat removal from the IC.

It is within the scope of this invention to extend the heat pipe configuration to ICs with a different number of interconnect levels.

Figure 1B:
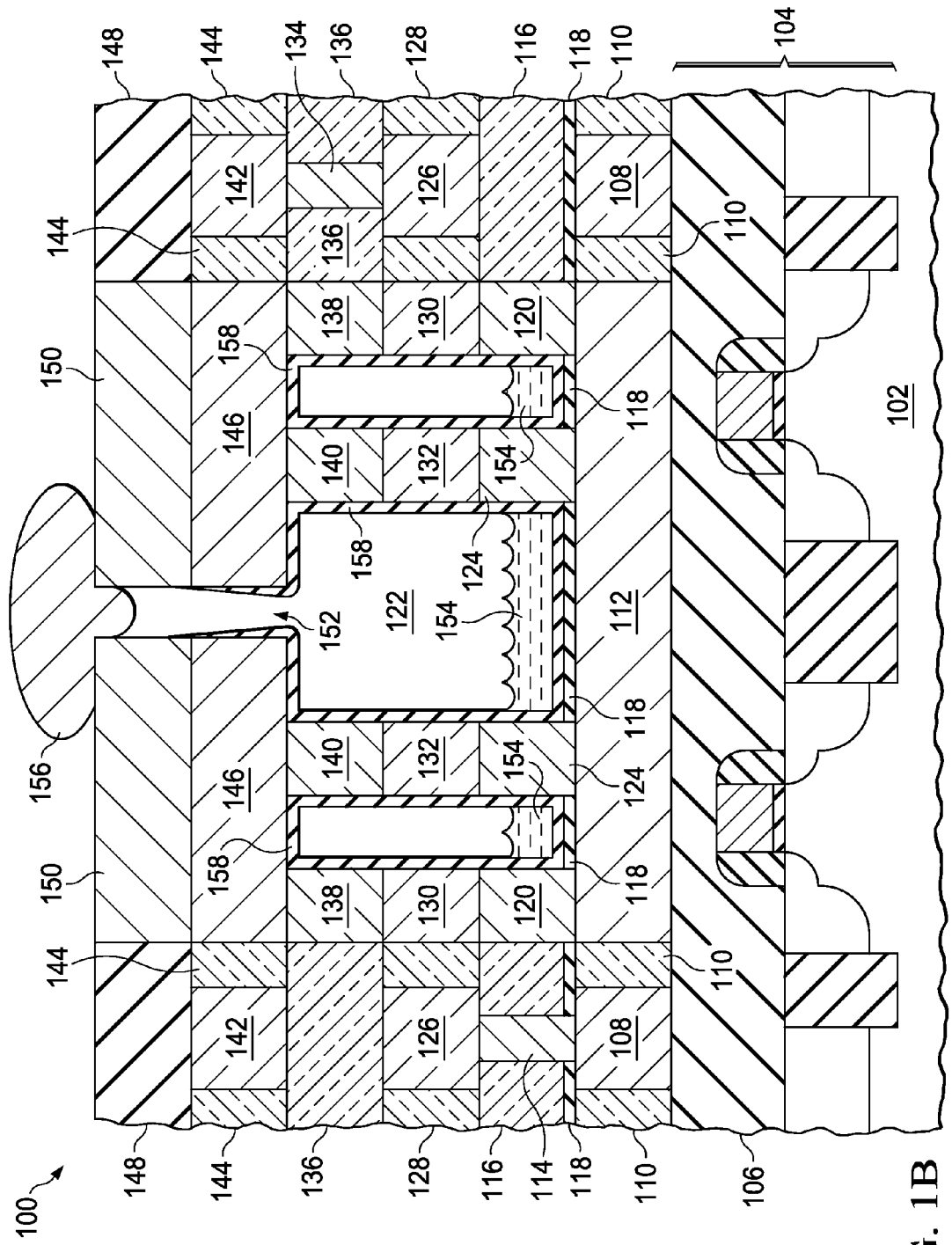
FIG. 1B is a cross-section of an integrated circuit with another embodiment of the instant invention, including a wicking liner.

FIG. 1B is a cross-section of an integrated circuit with another embodiment of the instant invention, including a wicking liner. In this embodiment, a heat pipe is formed on an integrated circuit as described above in reference to FIG. 1A. After the dielectric material is removed from the interior region (122) of the heat pipe, a wicking material (158) is deposited on the interior surface of the heat pipe. The heat pipe and integrated circuit are completed as described above in reference to FIG. 1A. The addition of the wicking material (158) is advantageous because it improves the thermal transfer capability of the heat pipe.

Figure 1C:
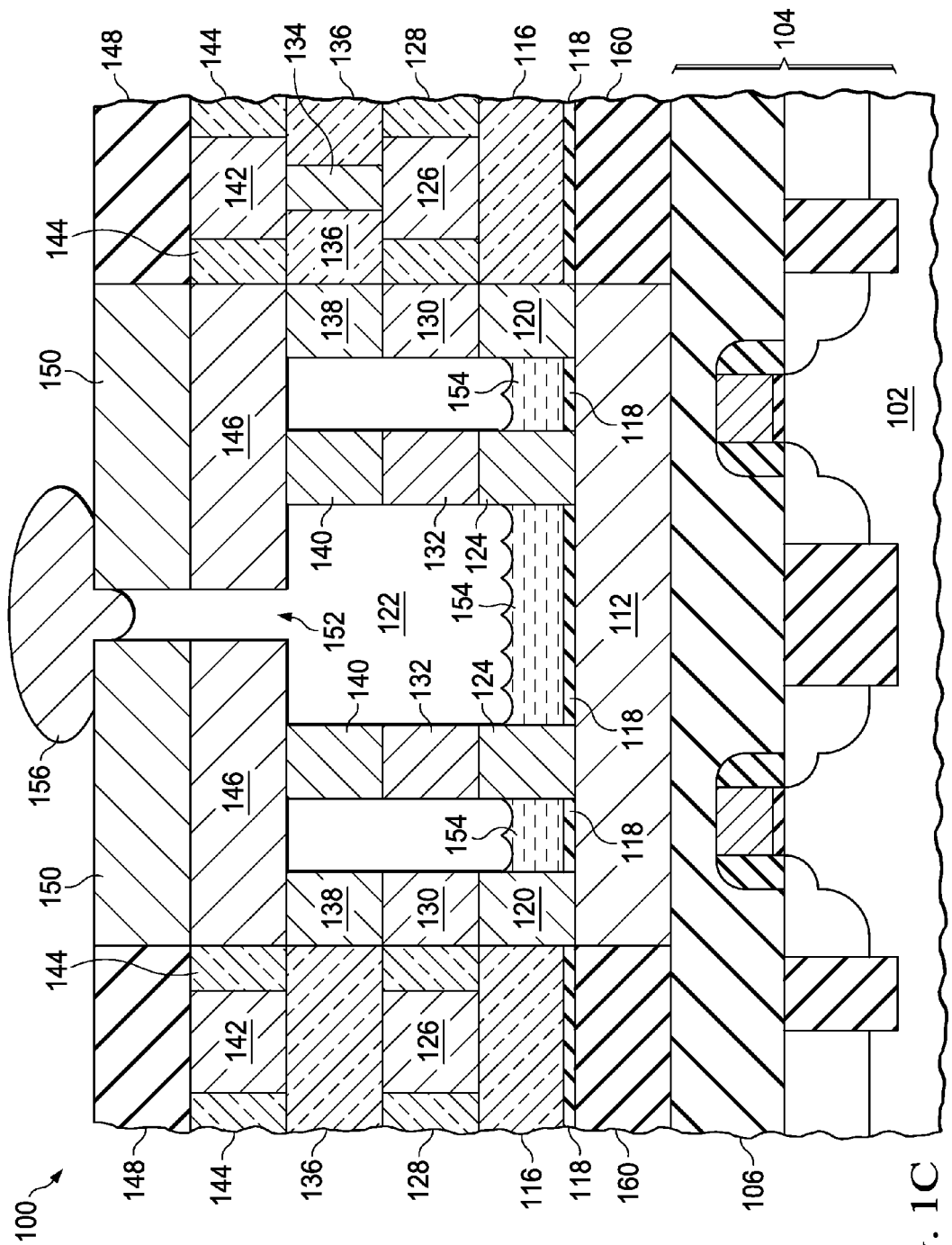
FIG. 1C is a cross-section of an integrated circuit with another embodiment of the instant invention, including thermally conductive dielectric around the heat pipe.

FIG. 1C is a cross-section of an integrated circuit with another embodiment of the instant invention, including thermally conductive dielectric around the heat pipe. In this embodiment, a heat pipe is formed on an integrated circuit as described above in reference to FIG. 1A. Dielectric material (160) in a region surrounding the heat pipe is comprised of a higher thermally conductive insulator, possibly diamond-like carbon, which has an atomic structure similar to diamond on spatial scales tens of atoms long, than the dielectric materials used for the PMD or ILD 1 or ILD 2. The use of a higher thermally conductive insulator in the region surrounding the heat pipe is advantageous because it increases the amount of heat from the components in the IC carried by the heat pipe. It is within the scope of this invention to extend the use of higher thermally conductive insulator to any level of interconnect in the IC.

Figure 2:
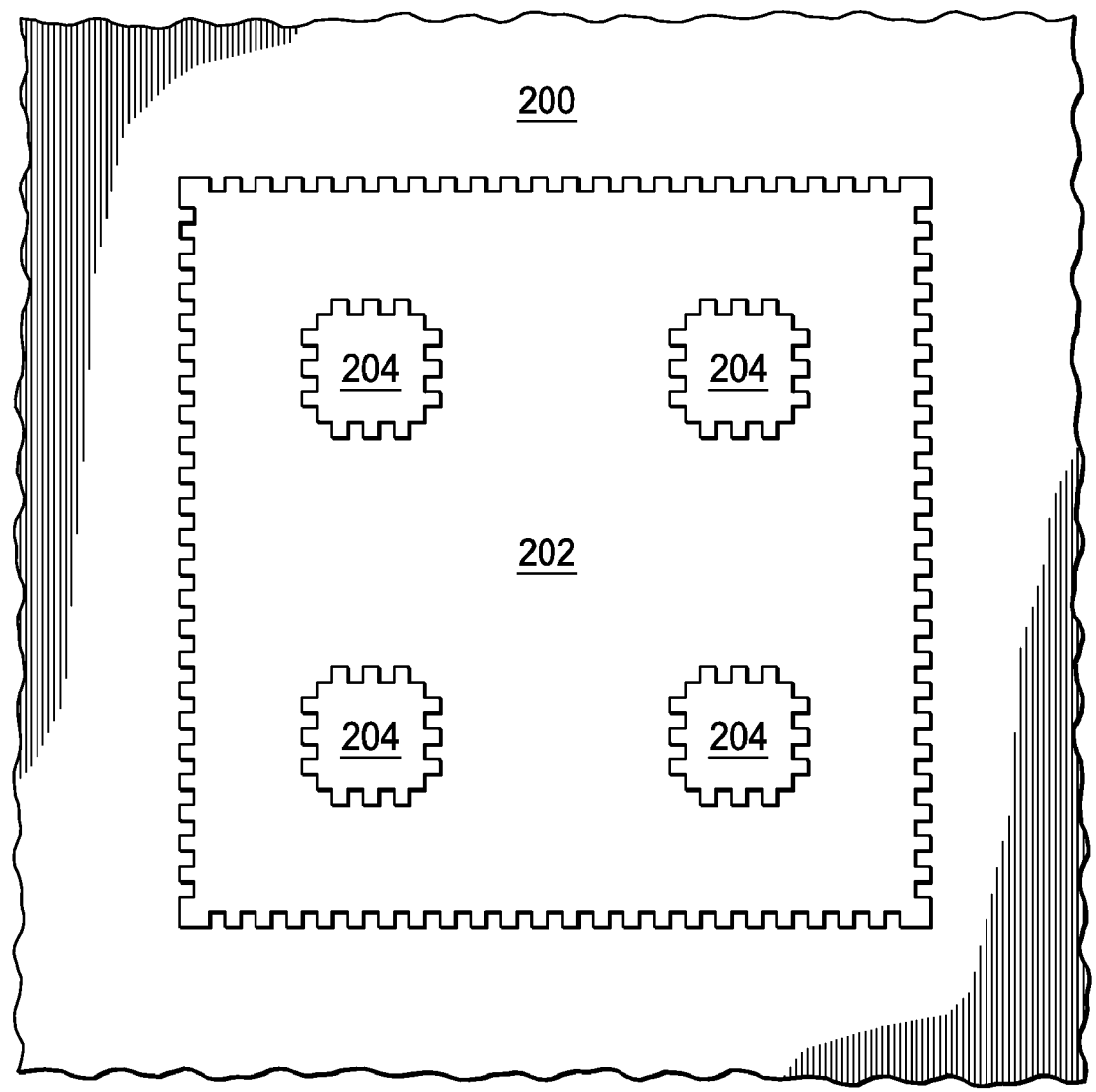
FIG. 2 is a fragmentary, diagrammatic top view on an enlarged scale of heat pipe in accordance with an embodiment of the instant invention, including reticulated inner wall surfaces.

FIG. 2 is a fragmentary, diagrammatic top view on an enlarged scale of heat pipe in accordance with an embodiment of the instant invention, including reticulated inner wall surfaces, that is, wall surfaces with grooves less than 50 nanometers wide, oriented vertically. Heat pipe wall (200) has reticulated inner surfaces (202) to improve transfer of the working fluid along the wall from the top element to the bottom element. This is advantageous because it increases the amount of heat from the components in the IC carried by the heat pipe. If strengthening elements are included, the surfaces of the strengthening elements (204) may also be reticulated to further improve transfer of the working fluid along the wall from the top element to the bottom element. Reticulation of the wall surfaces may be accomplished by patterning the reticulation photolithographically and etching the reticulation pattern during wall formation.

What is claimed is:

1. An apparatus comprising:
   a plurality of layers forming a multi-level metallization over at least one transistor;
   a bottom element layer that is formed within the multi-level metallization;
   an enclosure that is formed over at least a portion of the bottom element layer, wherein the enclosure has an interior region;
   a working fluid located in the interior region;
   an extraction via formed in the enclosure by which the working fluid is delivered to the interior region; and
   a plug formed over at least a portion of the enclosure so as to substantially seal the extraction via.

2. The apparatus of claim 1, wherein the enclosure further comprises:

a first strengthening element segment layer that is located in the interior region and that is formed over at least a portion of the bottom element layer; and a second strengthening element segment layer that is formed over at least a portion of the first strengthening element segment layer.

3. The apparatus of claim 1, wherein the interior region is reticulated.

4. The apparatus of claim 1, wherein the apparatus further comprises a wicking material layer formed over at least a portion of a surface of the interior region.

5. The apparatus of claim 4, wherein the wicking material layer is comprised of silicon dioxide.

6. The apparatus of claim 1, further comprising a dielectric material layer that is adjacent to at least a portion of the bottom element layer, wherein the dielectric material layer has a higher thermal conductivity than silicon dioxide.

7. The apparatus of claim 6, wherein the dielectric material layer is comprised of diamond-like carbon.

8. The apparatus of claim 1, wherein the bottom element layer and the enclosure are each comprised of copper or aluminum.

9. The apparatus of claim 1, wherein the working fluid is selected from the group consisting of acetone, methanol, perfluoromethylcyclohexane, ethanol, water, and toluene.

10. The apparatus of claim 1, wherein the enclosure further comprises:
a first enclosing wall layer formed over at least a portion of the bottom element layer;
a second enclosing wall layer formed over at least a portion of the first enclosing wall layer; and
a top element layer formed over at least a portion of the second enclosing wall layer, wherein the extraction via is formed through at least a portion of the top element layer.

11. The apparatus of claim 10, wherein the enclosure further comprises a bondpad that is formed over at least a portion of the top element layer, wherein the extraction via is formed through at least a portion of the bondpad, and wherein the plug is secured to at least a portion of the bondpad.

12. An apparatus comprising:
a substrate;
a first source/drain region formed in the substrate;
a second source/drain region formed in the substrate;
a gate structure formed on the substrate between the first and second source/drain regions to form a transistor;
a plurality of layers forming a multi-level metallization over at least the transistor;
a bottom element layer formed within the multi-level metallization;
an enclosure that is formed over at least a portion of the bottom element layer, wherein the enclosure has an interior region;
a working fluid located in the interior region;
an extraction via formed in the in the enclosure by which the working fluid is delivered to the interior region; and
a plug formed over at least a portion of the enclosure so as to substantially seal the extraction via.

13. The apparatus of claim 12, wherein the enclosure further comprises a plurality of layers, wherein the extraction via is formed through at least a portion of one of the plurality of layers forming the enclosure.

14. The apparatus of claim 13, wherein the apparatus further comprises a wicking material layer formed over at least a portion of a surface of the interior region.

15. The apparatus of claim 14, wherein the wicking material layer is comprised of silicon dioxide.

16. The apparatus of claim 13, further comprising a dielectric material layer that is adjacent to at least a portion of the bottom element layer, wherein the dielectric material layer has a higher thermal conductivity than silicon dioxide.

17. The apparatus of claim 14, wherein the dielectric material layer is comprised of diamond-like carbon.

18. The apparatus of claim 13, wherein the bottom element layer and the enclosure are each comprised of copper or aluminum.

19. The apparatus of claim 13, wherein the working fluid is selected from the group consisting of: acetone, methanol, perfluoromethylcyclohexane, ethanol, water, and toluene.

20. An apparatus comprising:
a substrate;
a first source/drain region formed in the substrate;
a second source/drain region formed in the substrate;
a gate structure formed on the substrate between the first and second source/drain regions to form a transistor;
a dielectric layer formed over the transistor;
a bottom element layer formed over at least a portion of the dielectric layer, wherein the bottom element layer includes aluminum or copper;
an enclosure having:
a plurality of wall section layers formed over at least a portion of the bottom element layer, wherein each of the wall section layers include aluminum or copper;
a top element layer formed over the at least a portion of at least one of wall section layers, wherein the wall section layers and top element layer are arranged to form an inner region within the enclosure, and wherein the top element layer includes aluminum or copper; and
a bondpad formed over at least a portion of the top element layer;
a plurality of strengthening elements formed in the region, where each strengthening element includes a plurality of layers having aluminum or copper;
a working fluid located in the interior region, wherein the working fluid is acetone, methanol, perfluoromethylcyclohexane, ethanol, water, or toluene;
an extraction via formed through a portion of the top element layer and the bondpad by which the working fluid is delivered to the interior region; and
a plug formed over at least a portion of the enclosure so as to substantially seal the extraction via.

21. The apparatus of claim 20, wherein the apparatus further comprises a wicking material layer of silicon dioxide formed over at least a portion of a surface of the interior region.

22. The apparatus of claim 20, further comprising a dielectric material layer that is adjacent to at least a portion of the bottom element layer, wherein the dielectric material layer has a higher thermal conductivity than silicon dioxide.

23. The apparatus of claim 22, wherein the dielectric material layer is comprised of diamond-like carbon.

* * * * *